(12) United States Patent
Ueda et al.

(10) Patent No.: US 10,111,330 B2
(45) Date of Patent: Oct. 23, 2018

(54) PRINTED CIRCUIT BOARD, ELECTRONIC COMPONENT, AND METHOD FOR PRODUCING PRINTED CIRCUIT BOARD

(71) Applicant: SUMITOMO ELECTRIC PRINTED CIRCUITS, INC., Koka-shi, Shiga (JP)

(72) Inventors: Hiroshi Ueda, Shiga (JP); Kousuke Miura, Shiga (JP)

(73) Assignee: SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/319,997

(22) PCT Filed: Jun. 24, 2015

(86) PCT No.: PCT/JP2015/068143
§ 371 (c)(1),
(2) Date: Dec. 19, 2016

(87) PCT Pub. No.: WO2015/199116
PCT Pub. Date: Dec. 30, 2015

(65) Prior Publication Data
US 2017/0135206 A1     May 11, 2017

(30) Foreign Application Priority Data

Jun. 26, 2014 (JP) ................. 2014-131952

(51) Int. Cl.
*H05K 1/05* (2006.01)
*H05K 1/09* (2006.01)
(Continued)

(52) U.S. Cl.
CPC ............ *H05K 1/05* (2013.01); *H05K 1/09* (2013.01); *H05K 1/165* (2013.01); *H05K 3/24* (2013.01);
(Continued)

(58) Field of Classification Search
CPC .. H05K 1/05; H05K 3/38; H05K 1/09; H05K 3/02; H05K 1/03; H01F 7/06; G03F 7/16; G03F 7/40
(Continued)

(56) References Cited

U.S. PATENT DOCUMENTS 4,745,401 A * 5/1988 Montean ............... G01V 15/00
257/E27.114
5,712,080 A * 1/1998 Satsu ....................... G03F 7/085
430/275.1
(Continued)

FOREIGN PATENT DOCUMENTS

JP         S62-189793 A     8/1987
JP         H01-99454 A      4/1989
(Continued)

OTHER PUBLICATIONS

Sunderarajan S. Mohan et al. Simple Accurate Expressions for Planar Spiral Inductances IEEE Journal of Solid-State Circuits, vol. 34, No. 10, Oct. 1999 .*

*Primary Examiner* — Michael F McAllister
(74) *Attorney, Agent, or Firm* — Drinker Biddle & Reath LLP

(57) ABSTRACT

A printed circuit board according to an embodiment of the present invention includes a base film having an insulating property, and a conductive pattern formed on at least one of surfaces of the base film, wherein at least a portion of the conductive pattern includes a core body, and a shrink layer formed by plating on an outer surface of the core body. The portion of the conductive pattern preferably has a striped configuration or a spiral configuration. The portion of the conductive pattern preferably has an average circuit gap width of 30 μm or less. The portion of the conductive pattern
(Continued)

preferably has an average aspect ratio of 0.5 or more. The plating is preferably electroplating or electroless plating.

7 Claims, 5 Drawing Sheets

(51) Int. Cl.
    *H05K 3/24*     (2006.01)
    *H05K 3/38*     (2006.01)
    *H05K 1/16*     (2006.01)

(52) U.S. Cl.
    CPC ..... *H05K 3/387* (2013.01); *H05K 2201/0338* (2013.01)

(58) Field of Classification Search
    USPC .......................................................... 174/250
    See application file for complete search history.

(56) References Cited

U.S. PATENT DOCUMENTS

| | | | | |
|---|---|---|---|---|
| 5,808,587 A * | 9/1998 | Shima | ................ | G07C 9/00103 |
| | | | | 340/10.34 |
| 6,517,893 B2 * | 2/2003 | Abys | ..................... | H05K 3/062 |
| | | | | 29/840 |
| 7,345,563 B2 * | 3/2008 | Pavier | ................. | H01F 17/0006 |
| | | | | 336/200 |
| 7,870,665 B2 * | 1/2011 | Nomura | .............. | H01F 17/0013 |
| | | | | 205/125 |
| 8,440,487 B2 * | 5/2013 | Furumura | .......... | G06K 19/0723 |
| | | | | 257/E21.599 |
| 9,251,942 B2 * | 2/2016 | Hashimoto | ......... | H01L 23/3114 |
| 2003/0188886 A1 * | 10/2003 | Fey | ........................ | H05K 3/242 |
| | | | | 174/256 |
| 2004/0164730 A1 * | 8/2004 | Schroeder | .............. | G01D 5/145 |
| | | | | 324/207.22 |
| 2008/0268267 A1 * | 10/2008 | Barbetta | ................ | H05K 3/244 |
| | | | | 428/458 |
| 2010/0011573 A1 * | 1/2010 | Kim | ..................... | H05K 3/4069 |
| | | | | 29/852 |
| 2011/0050292 A1 * | 3/2011 | Hui | ..................... | H01F 17/0006 |
| | | | | 327/109 |

FOREIGN PATENT DOCUMENTS

| | | |
|---|---|---|
| JP | H01-54874 B2 | 11/1989 |
| JP | H05-251852 A | 9/1993 |
| JP | 2004-095749 A | 3/2004 |
| JP | 2009-246363 A | 10/2009 |
| JP | 2011-192710 A | 9/2011 |

* cited by examiner

PRINTED CIRCUIT BOARD, ELECTRONIC COMPONENT, AND METHOD FOR PRODUCING PRINTED CIRCUIT BOARD

TECHNICAL FIELD

The present invention relates to a printed circuit board, an electronic component, and a method for producing the printed circuit board.

BACKGROUND ART

In recent years, with the trend toward a reduction in the size and weight of electronic devices, there has also been a demand for electronic components constituting electronic devices, such as coils, in which a reduction in the size and an increase in the density of conductive patterns are achieved. In order to meet the demand, as a replacement for conventional coils in which electric wires are wound around magnetic materials, a flexible printed circuit board having a coil pattern on a substrate has been developed (refer to Patent Literature 1).

However, in the flexible printed circuit board, a photolithographic technique using a resist pattern is employed to form a conductive pattern constituting the coil. For this reason, the linewidth and pitch of the conductive pattern depend on the linewidth and pitch of the resist pattern, which limits increase in the density of the conductive pattern.

CITATION LIST

Patent Literature

PTL 1: Japanese Unexamined Patent Application Publication No. 2011-192710

SUMMARY OF INVENTION

Technical Problem

Under the above-described circumstances, the present invention has been made. An object is to provide a printed circuit board and an electronic component that have high-density conductive patterns, and a method for producing the printed circuit board.

Solution to Problem

A printed circuit board according to an embodiment of the present invention includes a base film having an insulating property, and a conductive pattern formed on at least one of surfaces of the base film, wherein at least a portion of the conductive pattern includes a core body, and a shrink layer formed by plating on an outer surface of the core body.

An electronic component according to another embodiment of the present invention includes the printed circuit board.

A method for producing a printed circuit board according to still another embodiment of the present invention is a method for producing a printed circuit board including a base film having an insulating property, and a conductive pattern formed on at least one of surfaces of the base film, the method including a step of forming a core body of the conductive pattern by a subtractive method or a semi-additive method; and a step of forming, by plating, a shrink layer on at least a portion of an outer surface of the core body.

Advantageous Effects of Invention

The printed circuit board and the electronic component have high-density conductive patterns. Thus, these printed circuit board and electronic component are suitably usable as coils, for example. The method for producing the printed circuit board enables production of a printed circuit board having a high-density conductive pattern with ease and certainty.

DESCRIPTION OF EMBODIMENTS

Figure 1A:
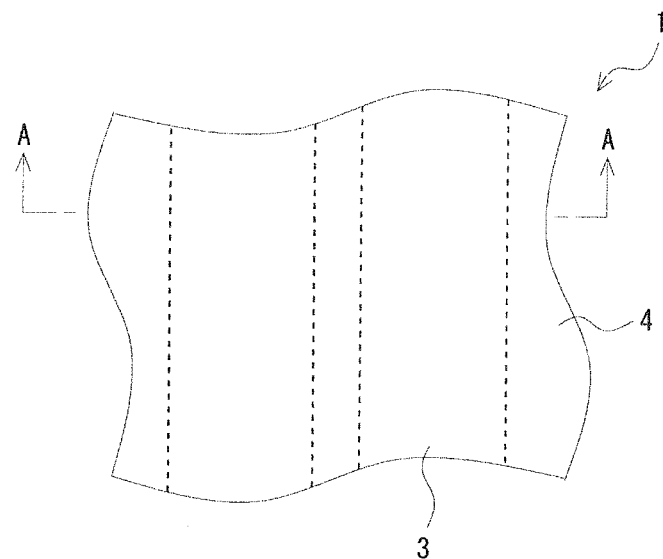
FIG. 1A is a schematic plan view of a printed circuit board according to an embodiment of the present invention.

Description of Embodiments of the Present Invention

A printed circuit board according to an embodiment of the present invention includes a base film having an insulating property, and a conductive pattern formed on at least one of surfaces of the base film, wherein at least a portion of the conductive pattern includes a core body, and a shrink layer formed by plating on an outer surface of the core body.

In the printed circuit board, at least a portion of the conductive pattern includes a core body and a shrink layer formed on the outer surface of the core body. Accordingly, the core body is formed by a subtractive method or a semi-additive method and the shrink layer is subsequently formed by plating, so that the printed circuit board can have a conductive pattern having a narrower gap width than that formed by a subtractive method or a semi-additive method. As a result, the printed circuit board has the conductive pattern that has a high density.

The portion of the conductive pattern preferably has a striped configuration or a spiral configuration. The conductive pattern including a core body and a shrink layer is thus formed so as to have a striped configuration or a spiral configuration, so that the conductive pattern has enhanced regularity, which results in enhanced uniformity in the electric resistance and dielectric constant, for example.

The portion of the conductive pattern preferably has an average circuit gap width of 30 μm or less. The average circuit gap width is set to such an upper limit or less, to thereby achieve a further increase in the density of the conductive pattern.

The portion of the conductive pattern preferably has an average aspect ratio of 0.5 or more. The aspect ratio is set to such a lower limit or more, to thereby achieve an increase in the thickness of the conductive pattern while maintaining its density.

The plating is preferably electroplating or electroless plating. The shrink layer is thus formed by electroplating, so that the shrink layer can be formed with ease and certainty. This enables a narrow average circuit gap width of the conductive pattern, which results in a further increase in the density. A portion of the circuit of the core body is electrically shut off during the plating, so that the shrink layer can be formed only on the outer surface of the desired core body, which facilitates adjustment of the size of the conductive pattern with its dimensional accuracy being maintained. Alternatively, the shrink layer is formed by electroless plating, which enables enhancement of the uniformity of the thickness of the shrink layer and also a reduction in the cost.

The core body and the shrink layer preferably have a main component that is copper or copper alloy. The core body and the shrink layer thus have a main component that is copper, which enhances the conductivity of the conductive pattern. In addition, a reduction in the production cost of the conductive pattern is achieved.

A conductive pattern is preferably further included on another one of the surfaces of the base film, and at least a portion of the conductive pattern also preferably includes the core body and the shrink layer. Such conductive patterns including a core body and a shrink layer are thus included on one and the other of the surfaces of the base film, which enables, in the case of producing the printed circuit board as a coil, an increase in the number of turns of the coil and adjustment of inductance while an increase in the area and thickness of the coil is suppressed. This enables an increase in the coupling coefficient and also a reduction in the size.

An electronic component according to an embodiment of the present invention includes the printed circuit board, so that it has a high-density conductive pattern and is excellent in utilization of space, for example.

A method for producing a printed circuit board according to an embodiment of the present invention is a method for producing a printed circuit board including a base film having an insulating property, and a conductive pattern formed on at least one of surfaces of the base film, the method including a step of forming a core body of the conductive pattern by a subtractive method or a semi-additive method; and a step of forming, by plating, a shrink layer on at least a portion of an outer surface of the core body.

According to this method for producing a printed circuit board, the core body is formed by a subtractive method or a semi-additive method and the shrink layer is subsequently formed by plating. This enables a conductive pattern having a narrower gap width than that formed by a subtractive method or a semi-additive method. As a result, the method for producing a printed circuit board provides a printed circuit board having a high-density conductive pattern.

Herein, the term "circuit gap width" denotes, in the case of a conductive pattern constituted by linear elements, the distance between adjacent surfaces facing each other, or denotes, in the case of a conductive pattern constituted by elements the peripheries of which are defined, such as dot elements, the minimum distance between adjacent peripheries in the conductive pattern. The term "aspect ratio" denotes the ratio of the average height to the average width of the conductive pattern. The term "width" denotes, in the case of a conductive pattern constituted by linear elements, the size in a direction orthogonal to the longitudinal direction, or denotes, in the case of a conductive pattern constituted by elements the peripheries of which are defined, such as dot elements, the size in a direction orthogonal to the maximum diameter direction. The term "height" denotes the distance from a surface of the conductive pattern, the surface being in contact with the base film, to a surface of the conductive pattern, the surface being on a side opposite to the base film. The term "main component" denotes a component having the maximum content, for example, a component having a content of 50 mass % or more. Incidentally, these definitions similarly apply to, for example, other members described below.

Details of Embodiments of the Present Invention

Hereinafter, a printed circuit board and a method for producing the printed circuit board according to embodiments of the present invention will be described. Incidentally, the term "front surface side" in these embodiments denotes, in the thickness direction of the base film, a side of the base film on which the conductive pattern is formed. The front and back in the embodiments do not define the front and back of the printed circuit board being used.

[Printed Circuit Board]

Figure 1B:
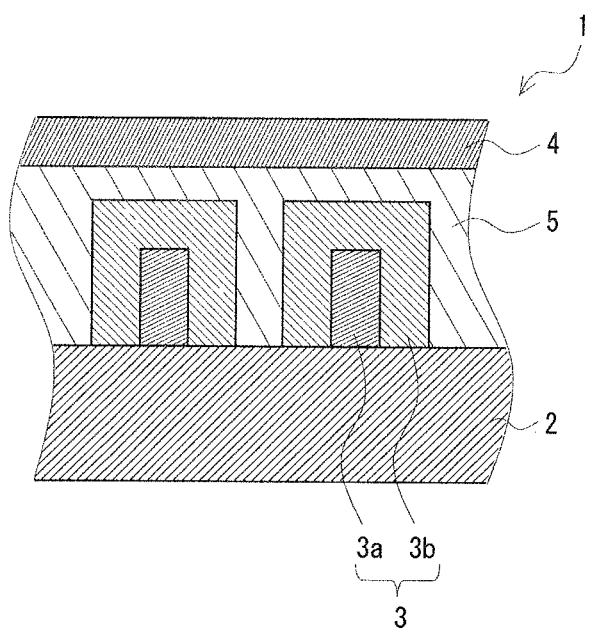
FIG. 1B is a schematic sectional view taken along line A-A in FIG. 1A.

In FIGS. 1A and 1B, a printed circuit board 1 is what is called a flexible printed circuit board having flexibility and mainly including a base film 2 and a conductive pattern 3 formed on the front surface side of the base film 2. The printed circuit board 1 may further include a covering film on the front surface side of the base film 2 or the conductive pattern 3.

<Base Film>

The base film 2 has an insulating property and flexibility. Examples of the main component of the base film 2 include polyimide, polyethylene terephthalate, fluororesins, and liquid crystal polymers. The base film 2 may contain, for example, a resin other than the exemplified resins such as polyimide, and an antistatic agent.

The lower limit of the average thickness of the base film 2 is not particularly limited, and is preferably 3 μm, more preferably 5 μm, still more preferably 10 μm. On the other hand, the upper limit of the average thickness of the base film 2 is not particularly limited, and is preferably 200 μm, more preferably 150 μm, still more preferably 100 μm. When the average thickness of the base film 2 is less than the lower limit, the insulating property and mechanical strength may become insufficient. On the other hand, when the average thickness of the base film 2 is more than the upper limit, the printed circuit board 1 may have an excessively large thickness.

Herein, the term "average thickness" denotes the average of thicknesses measured at any ten points. Incidentally, this definition similarly applies to the "average thickness" of, for example, other members described below.

<Conductive Pattern>

The conductive pattern 3 is formed on the front surface side of the base film 2 directly or with another layer therebetween. The conductive pattern 3 includes a core body 3a and a shrink layer 3b.

(Core Body)

The core body 3a is formed on a surface of the base film 2 by a subtractive method or a semi-additive method. According to the subtractive method, a metal foil formed on the base film 2 is etched to form a core body 3a having a desired pattern. Alternatively, according to the semi-additive method, a thin conductive pattern (seed layer) is first formed on the front surface side of the base film 2, and a resist pattern is formed on the surface of the seed layer by a photoresist method. Subsequently, the exposed surface of the seed layer is plated through the resist pattern serving as a mask, to thereby form a core body 3a having a desired pattern.

Examples of the material for the core body 3a include copper, aluminum, silver, gold, nickel, alloys of the foregoing, and stainless steel. Of these, preferred are copper and copper alloy from the viewpoint of providing high conductivity and the viewpoint of achieving a reduction in the cost.

The upper limit of the average width of the core body 3a is preferably 30 µm, more preferably 20 µm. On the other hand, the lower limit of the average width is preferably 2 µm, more preferably 5 µm. When the average width is less than the lower limit, the conductive pattern 3 may have insufficient continuity. Conversely, when the average width is more than the upper limit, a reduction in the size of the printed circuit board 1 may become difficult to achieve.

The lower limit of the average circuit gap width of the core body 3a is preferably 15 µm, more preferably 20 µm. On the other hand, the upper limit of the average circuit gap width is preferably 50 µm, more preferably 30 µm. When the average circuit gap width is less than the lower limit, plating for forming the shrink layer 3b may cause filling of the gap between adjacent portions of the core body 3a, which may result in a short circuit of the conductive pattern 3. Conversely, when the average circuit gap width is more than the upper limit, the density of the conductive pattern 3 may not be sufficiently increased.

The upper limit of the average height of the core body 3a is preferably 50 µm, more preferably 40 µm. On the other hand, the lower limit of the average height is preferably 5 µm, more preferably 10 µm. When the average height is more than the upper limit, a reduction in the size of the printed circuit board 1 may become difficult to achieve. When the average height is less than the lower limit, the conductive pattern 3 may have insufficient continuity.

(Shrink Layer)

The shrink layer 3b is formed by plating on the outer surface of the core body 3a. This shrink layer 3b covers the core body 3a to form the conductive pattern 3 having a narrow gap width. This plating may be performed only once or by plural plating steps.

The plating used for forming the shrink layer 3b is preferably electroplating or electroless plating, more preferably electroplating. Examples of the type of such plating include copper plating, gold plating, nickel plating, and plating with alloys of the foregoing. Of these, copper plating and copper alloy plating are preferred from the viewpoint of providing high conductivity and the viewpoint of achieving a reduction in the cost.

The material for the shrink layer 3b is preferably the same as that for the core body 3a. Thus, the core body 3a and the shrink layer 3b are formed of the same material, so that the core body 3a and the shrink layer 3b have uniform electric properties such as a dielectric constant, which results in a further increase in the conductivity of the conductive pattern 3.

The upper limit of the average thickness of the shrink layer 3b is preferably 15 µm, more preferably 12 µm. On the other hand, the lower limit of the average thickness is preferably 5 µm, more preferably 8 µm. When the average thickness is more than the upper limit, the conductive pattern 3 may have excessively increased thickness and height. Conversely, when the average thickness is less than the lower limit, a sufficient increase in the density of the conductive pattern 3 may not be achieved. Herein, the phrase "thickness of the shrink layer" denotes a distance in the thickness direction of the base film 2 or a distance in a direction perpendicular to the thickness direction, from a surface of the shrink layer 3b, the surface being in contact with the core body 3a, to a surface of the shrink layer 3b, the surface being on a side opposite to the core body 3a.

The conductive pattern 3 including the core body 3a and the shrink layer 3b preferably has a striped configuration or a spiral configuration, more preferably a spiral configuration. When the conductive pattern 3 has such a configuration, the conductive pattern 3 has enhanced regularity. This results in enhancement of uniformity of, for example, electric resistance and a dielectric constant.

The upper limit of the average circuit gap width of the conductive pattern 3 is preferably 30 µm, more preferably 20 µm. On the other hand, the lower limit of the average circuit gap width is preferably 3 µm, more preferably 5 µm. When the average circuit gap width is more than the upper limit, a sufficient increase in the density of the conductive pattern 3 may not be achieved. Conversely, when the average circuit gap width is less than the lower limit, the conductive pattern 3 may become difficult to form.

The lower limit of the average aspect ratio of the conductive pattern 3 is preferably 0.5, more preferably 0.8. On the other hand, the upper limit of the average aspect ratio is preferably 2, more preferably 1.5. When the average aspect ratio is less than the lower limit, a sufficient increase in the density of the conductive pattern 3 may not be achieved. Conversely, when the average aspect ratio is more than the upper limit, the conductive pattern 3 may become readily damaged or separated, for example.

The upper limit of the average width of the conductive pattern 3 is preferably 40 µm, more preferably 35 µm. On the other hand, the lower limit of the average width is preferably 7 µm, more preferably 10 µm. When the average width is more than the upper limit, a sufficient increase in the density of the conductive pattern 3 may not be achieved. Conversely, when the average width is less than the lower limit, the conductive pattern 3 may become readily damaged or separated, for example.

The upper limit of the average height of the conductive pattern 3 is preferably 40 µm, more preferably 30 µm. On the other hand, the lower limit of the average height is preferably 10 µm, more preferably 15 µm. When the average height is more than the upper limit, a reduction in the size of the printed circuit board 1 may become difficult to achieve. When the average height is less than the lower limit, the conductive pattern 3 may have insufficient continuity.

The upper limit of the average pitch of the conductive pattern 3 is preferably 70 µm, more preferably 50 µm. On the other hand, the lower limit of the average pitch is preferably 10 µm, more preferably 15 µm. When the average pitch is more than the upper limit, a sufficient increase in the density of the conductive pattern 3 may not be achieved. Conversely, when the pitch is less than the lower limit, the conductive pattern 3 may become difficult to form. Herein, the term "pitch" denotes, in the case of a conductive pattern 3 constituted by linear elements, the distance between their center lines, or denotes, in the case of a conductive pattern 3 constituted by elements the peripheries of which are defined, such as dot elements, the distance between their center points.

<Covering Film>

A covering film 4 is formed on a surface of a laminated body including the base film 2 and the conductive pattern 3, the surface being on a side on which the conductive pattern 3 is formed, with an adhesive layer 5 being interposed between the covering film 4 and the surface. This covering film 4 is formed to protect the conductive pattern 3 and the like.

The covering film 4 is a flexible film, and preferably has an insulating property. Examples of the main component of the covering film 4 include polyimide, epoxy resins, phenolic resins, acrylic resins, polyesters, thermoplastic polyimide, polyethylene terephthalate, fluororesins, and liquid crystal polymers. In particular, polyimide is preferred from the viewpoint of heat resistance. Incidentally, this covering film 4 may contain, for example, a resin other than the main component, a weather resistance agent, or an antistatic agent.

The lower limit of the average thickness of the covering film 4 is not particularly limited, and is preferably 3 μm, more preferably 10 μm. On the other hand, the upper limit of the average thickness of the covering film 4 is not particularly limited, and is preferably 500 μm, more preferably 150 μm. When the average thickness of the covering film 4 is less than the lower limit, protection for the conductive pattern 3 and the like may become insufficient and, in the case of forming the covering film 4 so as to have an insulating property, a sufficient insulating property may not be provided. Conversely, when the average thickness of the covering film 4 is more than the upper limit, the incremental protection effect for the conductive pattern 3 and the like may become weak, and the covering film 4 may have insufficient flexibility.

<Adhesive Layer>

The adhesive layer 5 is formed to bond the covering film 4 to a surface of the laminated body including the base film 2 and the conductive pattern 3, the surface being on a side on which the conductive pattern 3 is formed. The lower limit of the average thickness of this adhesive layer 5 is preferably 5 μm, more preferably 10 μm. On the other hand, the upper limit of the average thickness of the adhesive layer 5 is preferably 100 μm, more preferably 75 μm. When the average thickness of the adhesive layer 5 is less than the lower limit, the bonding strength between the covering film 4 and the laminated body may become insufficient. Conversely, when the average thickness of the adhesive layer 5 is more than the upper limit, the printed circuit board 1 may have an excessively increased thickness.

<Advantages>

The printed circuit board 1 includes the conductive pattern 3 including the core body 3a and the shrink layer 3b formed on the outer surface of the core body 3a. Accordingly, in the printed circuit board 1, the core body 3a is formed by a subtractive method or a semi-additive method, and the shrink layer 3b is subsequently formed by plating, so that the conductive pattern 3 has a narrower gap width than that formed by a subtractive method or a semi-additive method. As a result, the printed circuit board 1 has the conductive pattern 3 that has a high density.

[Method for Producing Printed Circuit Board]

Hereinafter, a method for producing a printed circuit board according to an embodiment will be described with reference to the printed circuit board 1.

The method for producing the printed circuit board mainly includes a step of forming, as a layer, the core body 3a of the conductive pattern 3 by a subtractive method or a semi-additive method, and a step of forming the shrink layer 3b on at least a portion of the outer surface of the core body 3a by plating. The method may further include a step of, after formation of the shrink layer 3b, forming the covering film 4 on the base film 2 and the conductive pattern 3.

<Core Body Formation Step>

In the core body formation step, the core body 3a is formed as a layer on a surface of the base film 2 by a subtractive method or a semi-additive method. The layer formation method is preferably the semi-additive method from the viewpoint that finer patterns can be readily formed.

<Subtractive Method>

Figure 2A:
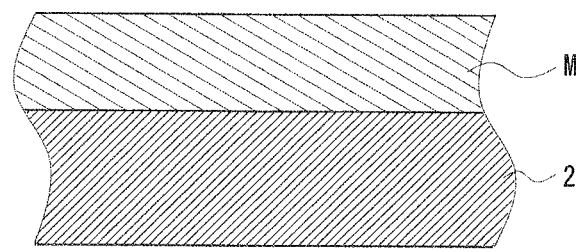
FIG. 2A is a schematic sectional view illustrating a method for producing the printed circuit board in FIG. 1A.
Figure 2B:
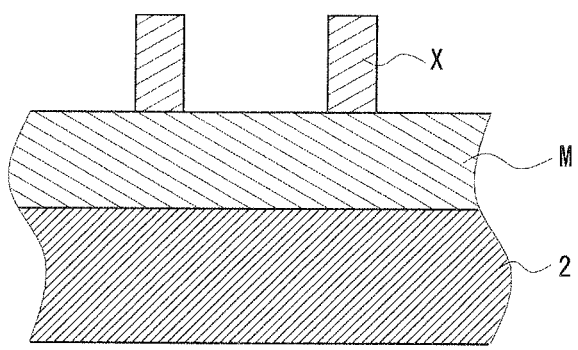
FIG. 2B is a schematic sectional view illustrating a method for producing the printed circuit board in FIG. 1A.
Figure 2C:
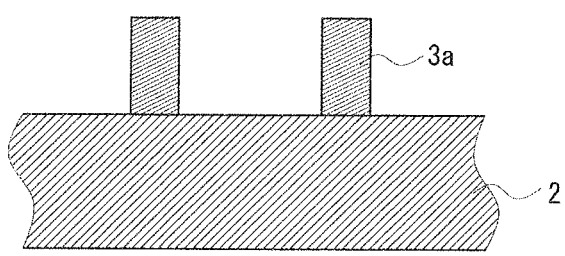
FIG. 2C is a schematic sectional view illustrating a method for producing the printed circuit board in FIG. 1A.

When the core body 3a is formed by the subtractive method, as illustrated in FIGS. 2A to 2C, the core body formation step mainly includes a step of forming a metal foil M on the base film 2, a step of forming a resist pattern X on the surface of the metal foil M, a step of etching the metal foil M through the resist pattern X serving as a mask, and a step of stripping the resist pattern X.

(Metal Foil Formation Step)

In this step, as illustrated in FIG. 2A, the metal foil M is formed on the base film 2. Examples of such a formation process include a bonding process of using an adhesive to bond the metal foil M to the base film 2; a casting process of applying, to the metal foil M, a resin composition that is a material for the base film 2; a sputtering/plating process of forming a seed layer on the base film 2, and subsequently forming a metal layer on this seed layer by electroplating; and a lamination process of bonding the metal foil with a hot press.

The lower limit of the average thickness of the metal foil M is not particularly limited, and is preferably 5 μm, more preferably 10 μm. On the other hand, the upper limit of the average thickness of the metal foil M is not particularly limited, and is preferably 100 μm, more preferably 75 μm, still more preferably 50 μm. When the average thickness is less than the lower limit, the conductive pattern 3 may have insufficient continuity. Conversely, when the average thickness is more than the upper limit, the demand for a reduction in the thickness of the printed circuit board 1 may not be satisfied.

(Resist Pattern Formation Step)

In this step, as illustrated in FIG. 2B, the resist pattern X is formed on the surface of the metal foil M. Specifically, a resist film is formed on the surface of the metal foil M, and subsequently exposed to light and developed to thereby form the resist pattern X having a predetermined pattern. Examples of the formation process of the resist film include a process of applying a resist composition to the surface of the metal foil M, and a process of placing a dry film photoresist on the surface of the metal foil M. The exposure and development conditions for the resist film can be appropriately adjusted in accordance with, for example, the resist composition used.

(Metal Foil Etching Step)

In this step, the metal foil M is etched through the resist pattern X serving as a mask. Such an etching process may be a known process used in the subtractive method.

(Resist Pattern Stripping Step)

In this step, the resist pattern X is stripped from the metal foil M. Specifically, a stripper is used to strip the resist pattern. This stripper may be a known stripper. Examples of the stripper include alkaline aqueous solutions of, for example, sodium hydroxide and potassium hydroxide; organic acid solutions of, for example, alkylbenzenesulfonic acids; and mixed solutions of an organic amine such as ethanolamine and a polar solvent. The resist pattern X is stripped to thereby provide, as illustrated in FIG. 2C, a laminated body in which the core body 3a is formed on the surface of the base film 2.

<Semi-Additive Method>

When the core body 3a is formed by the semi-additive method, as illustrated in FIGS. 3A to 3D, the core body formation step mainly includes a step of forming a thin conductive layer (seed layer) S on a surface of the base film 2, a step of forming a resist pattern X on the surface of the seed layer S, a step of plating a surface of the seed layer S exposed through the resist pattern X to form a metal pattern Y, a step of stripping the resist pattern X, and a step of etching the seed layer S through the metal pattern Y serving as a mask. The core body 3a has a structure in which the seed layer S and the metal pattern Y are sequentially stacked.

(Seed Layer Formation Step)

Figure 3A:
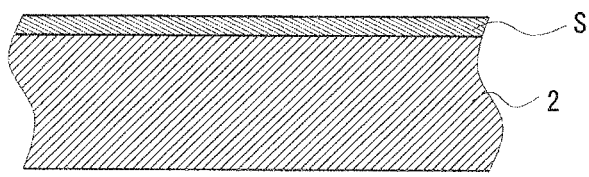
FIG. 3A is a schematic sectional view illustrating a method for producing the printed circuit board in FIG. 1A, the method being different from that in FIGS. 2A to 2D.

In this step, as illustrated in FIG. 3A, the seed layer S is formed on a surface of the base film 2. This seed layer S may be formed by a known process. Examples of the process include electroless plating, sputtering, vapor deposition, and application of a conductive-fine-particle dispersion liquid. Examples of the material for the seed layer S include known materials such as copper, silver, nickel, and palladium. Of these, copper is preferred.

The upper limit of the average thickness of the seed layer S is preferably 10 nm, more preferably 8 nm. On the other hand, the lower limit of the average thickness is preferably 2 nm, more preferably 3 nm. When the average thickness is more than the upper limit, the seed layer S other than the core body 3a may not be sufficiently etched off. Conversely, when the average thickness is less than the lower limit, the metal pattern Y may become difficult to form on the surface of the seed layer S.

(Resist Pattern Formation Step)

Figure 3B:
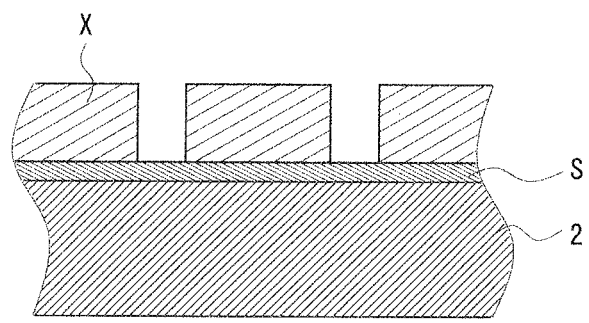
FIG. 3B is a schematic sectional view illustrating a method for producing the printed circuit board in FIG. 1A, the method being different from that in FIGS. 2A to 2D.

In this step, as illustrated in FIG. 3B, the resist pattern X is formed on the surface of the seed layer S. This resist pattern may be formed by the same process as the process for forming the resist pattern X in the above-described subtractive method.

(Metal Pattern Formation Step)

Figure 3C:
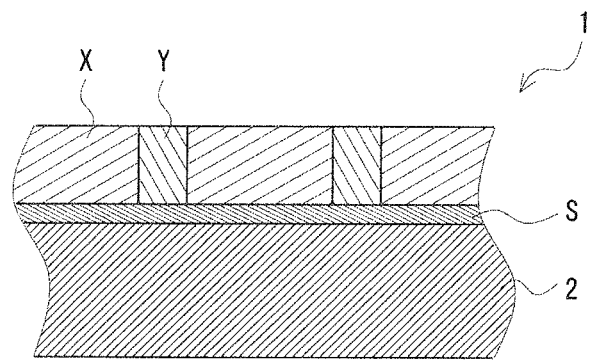
FIG. 3C is a schematic sectional view illustrating a method for producing the printed circuit board in FIG. 1A, the method being different from that in FIGS. 2A to 2D.

In this step, as illustrated in FIG. 3C, electroplating is performed to form the metal pattern Y on a region of the seed layer S, the region not having the resist pattern X thereon. This electroplating may suitably employ the same materials as those exemplified as the materials for the core body 3a.

(Resist Pattern Stripping Step)

In this step, the resist pattern X is stripped from the seed layer S. This stripping is performed by the same process as in the above-described subtractive method.

(Seed Layer Etching Step)

Figure 3D:
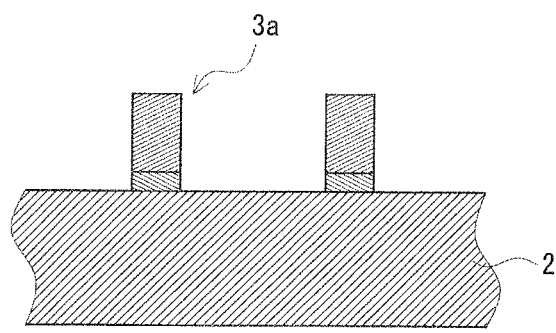
FIG. 3D is a schematic sectional view illustrating a method for producing the printed circuit board in FIG. 1A, the method being different from that in FIGS. 2A to 2D.

In this step, the seed layer S is etched through the metal pattern Y serving as a mask. As a result of this etching, as illustrated in FIG. 3D, a laminated body is provided in which the core body 3a is formed on the base film 2. This etching employs an etchant that corrodes the metal forming the seed layer S. Thus, the etchant may also corrode the metal pattern Y. However, such etching of the metal pattern Y is negligible because it has a much larger thickness than the seed layer S.

<Shrink Layer Formation Step>

Figure 2D:
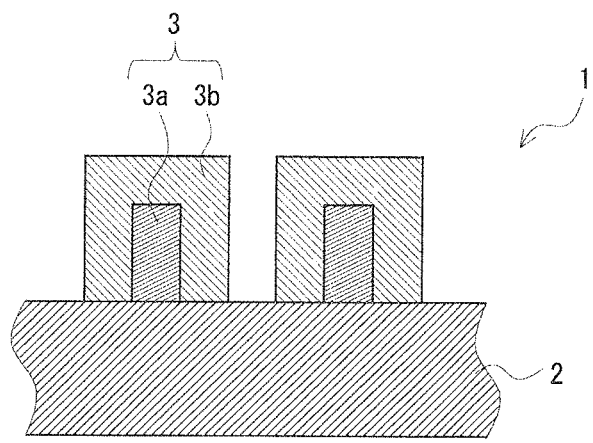
FIG. 2D is a schematic sectional view illustrating a method for producing the printed circuit board in FIG. 1A.
Figure 3E:
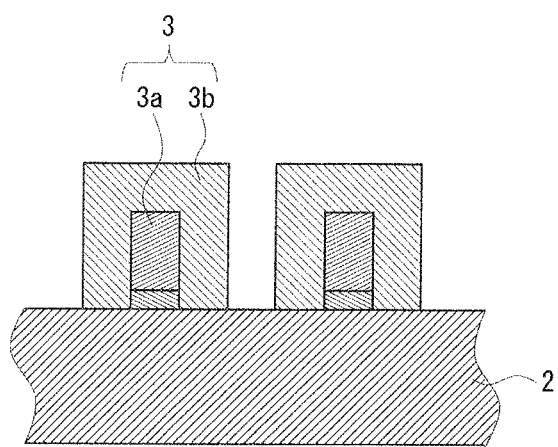
FIG. 3E is a schematic sectional view illustrating a method for producing the printed circuit board in FIG. 1A, the method being different from that in FIGS. 2A to 2D.

In the shrink layer formation step, the core body 3a is plated to form the shrink layer 3b thereon. As a result, as illustrated in FIGS. 2D and 3E, the conductive pattern 3 is formed that includes the core body 3a and the shrink layer 3b.

The upper limit of the temperature during plating for forming the shrink layer 3b is preferably 60° C., more preferably 50° C. On the other hand, the lower limit of the plating temperature is preferably 10° C., more preferably 20° C. When the plating temperature is more than the upper limit, the core body 3a and the like may be deformed, for example. Conversely, when the plating temperature is less than the lower limit, the shrink layer 3b may have an insufficient thickness.

The upper limit of the time for plating of forming the shrink layer 3b is preferably 200 minutes, more preferably 150 minutes. On the other hand, the lower limit of the plating time is preferably 10 minutes, more preferably 20 minutes. When the plating time is more than the upper limit, the shrink layer 3b has an increased thickness, which may result in, for example, a short circuit in the conductive pattern 3. Conversely, when the plating time is less than the lower limit, the shrink layer 3b may have an insufficient thickness.

<Covering Film Placement Step>

In the covering film placement step, the adhesive layer 5 is first placed on one of the surfaces of the covering film 4; and this laminated body is placed on the base film 2 such that the adhesive layer 5 side of the laminated body faces the base film 2. Subsequently, the base film 2, the conductive pattern 3, and the covering film 4 are heated to cure the adhesive layer 5. The temperature of this heating is preferably 120° C. or more and 200° C. or less, and the time for the heating is preferably 1 minute or more and 60 minutes or less. The heating temperature and heating time are set to be in these ranges, so that the adhesive layer 5 effectively exerts its adhesiveness and alteration of the base film 2 and the like can be suppressed. The process of the heating is not particularly limited. Examples of the process include heating processes using heating units such as a hot press, an oven, and a hot plate; and preferred is to use a hot press to perform heating under pressing.

[Advantages]

According to the method for producing a printed circuit board, the core body 3a is formed by the subtractive method or the semi-additive method, and the shrink layer 3b is subsequently formed by plating, so that the conductive pattern 3 has a narrower gap width than that formed by the subtractive method or the semi-additive method. As a result, the method for producing a printed circuit board provides the printed circuit board 1 including the high-density conductive pattern 3.

[Electronic Component]

The electronic component includes the printed circuit board. The electronic component may further include an electronic element other than the printed circuit board.

The electronic element is not particularly limited as long as it is generally used for electronic components, and may be a passive element or an active element. Examples of the electronic element include capacitors, inductors, resistors, light-emitting diodes, photo-sensors, and IC chips.

<Coil>

Figure 4A:
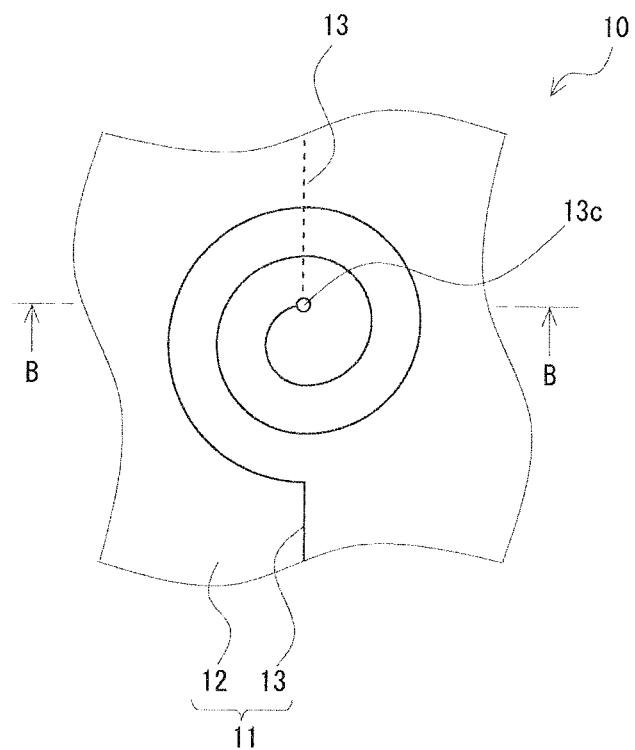
FIG. 4A is a schematic plan view of a coil that is an electronic component according to an embodiment of the present invention.
Figure 4B:
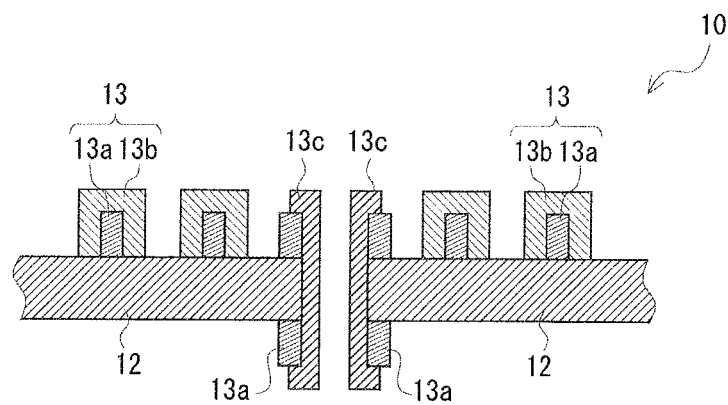
FIG. 4B is a schematic sectional view taken along line B-B in FIG. 4A.

A coil 10 illustrated in FIGS. 4A and 4B is an example of the electronic component including the printed circuit board 11. In the printed circuit board 11 including the coil 10, conductive patterns 13 including a core body 13a and a shrink layer 13b are formed on the front surface side and back surface side of a base film 12.

The conductive patterns 13 have a single continuous line configuration including a spiral portion formed on the front surface side of the base film 12, an outer linear portion connected to the outermost end of the spiral portion, and an inner linear portion formed on the back surface side of the base film 12 and connected via a through-hole 13c to the innermost end of the spiral portion. Ends of the outer linear portion and the inner linear portion, the ends not being connected to the spiral portion, are connected to a power source (not shown).

In the spiral portion, the width of the core body 13a preferably increases from the outside to the inside. As described above, the shrink layer 13b is formed by plating, and the plating solution tends not to enter gaps in the core body 13a in the inside portion of the spiral portion. Thus, the shrink layer 13b tends to have differing thicknesses for the outside and inside of the spiral portion. For this reason, the width of the core body 13a is increased from the outside to the inside, to thereby enhance the uniformity of the width of the conductive pattern 13.

When the width of the core body 13a is increased from the outside to the inside, regarding a width increase ratio of the core body 13a per turn in the spiral portion, the upper limit is preferably 500%, more preferably 400%. On the other hand, the lower limit of the width increase ratio is preferably 5%, more preferably 10%. When the width increase ratio is more than the upper limit, the width of the conductive pattern 13 may excessively vary between the outside and inside of the spiral portion, so that it may become difficult to increase the number of turns of the coil, or the outside of the conductive pattern 13 may tend to be damaged. Conversely, when the width increase ratio is less than the lower limit, the uniformity of the width of the conductive pattern 13 may not be sufficiently enhanced. Herein, the term "width increase ratio" denotes a value represented by $\{(L2-L1)/L1\}\times 100$ where L1 represents the pre-increased width of the conductive pattern 13, and L2 represents the post-increased width.

(Method for Producing Coil)

The method for producing the coil 10 mainly includes a step of forming the conductive pattern 13 on the front surface side, a step of forming the conductive pattern 13 on the back surface side, and a step of forming the through-hole 13c. The front-surface-side conductive-pattern formation step and the back-surface-side conductive-pattern formation step include the core body formation step and the shrink layer formation step of the above-described method for producing a printed circuit board.

In the through-hole formation step, the front-surface-side conductive pattern 13 is electrically connected to the back-surface-side conductive pattern 13. This through-hole 13c may be formed by forming a through-hole in the laminated body having the front-surface-side conductive pattern 13 and the back-surface-side conductive pattern 13, and plating this through-hole with a metal such as copper, or injecting, for example, silver paste or copper paste into the through-hole and curing the paste by heating.

The front-surface-side conductive-pattern formation step and the back-surface-side conductive-pattern formation step may be performed simultaneously, or one of the steps may be performed and the other step may be subsequently performed.

<Advantages>

The coil 10 includes the printed circuit board 11, so that the conductive pattern 13 has a narrow gap width in the spiral portion, and has a high density. Therefore, the coil 10 enables a reduction in its size, and has a high inductance.

Other Embodiments

The embodiments disclosed herein should be understood as examples in all respects and not being restrictive. The scope of the present invention is not limited to the configurations of the above-described embodiments but is indicated by Claims. The scope of the present invention is intended to embrace all the modifications within the meaning and range of equivalency of the Claims.

The printed circuit board is not limited to a single-sided printed circuit board having a conductive pattern on a single surface or a double-sided printed circuit board having conductive patterns on both surfaces. The printed circuit board may be a multilayer printed circuit board having a stack of plural conductive patterns.

The printed circuit board may be a flexible printed circuit board in which the base film has flexibility, or may be, what is called, a rigid circuit board in which the base film does not have flexibility.

The above-described embodiment is described with an example in which the whole conductive pattern includes the core body and the shrink layer. However, embodiments are not limited to this example, and a portion of the conductive pattern may have the core body alone. In this case, the shrink layer is formed only on a necessary portion of the core body, to thereby facilitate adjustment of the size of the conductive pattern and achieve a reduction in the size of the printed circuit board. Examples of the method for forming the shrink layer only on a portion of the core body include a method of masking the core body prior to the shrink layer formation step, and a method of electrically shutting off a portion of the core body and performing electroplating to form the shrink layer.

When the electronic component is a coil, this coil is not limited to the above-described embodiment in which a spiral conductive pattern is formed only on the front surface of the base film; and the base film may further include, on the back surface side, a spiral conductive pattern including a core body and a shrink layer.

In this case, the front-surface-side spiral conductive pattern and the back-surface-side spiral conductive pattern of the base film are preferably formed at positions corresponding to each other with the base film therebetween and have the same shape. In this way, the spiral conductive patterns having the same shape are formed at the corresponding positions of both surfaces of the base film, to thereby increase the coupling coefficient of the coil.

When the electronic component is a coil, a multilayer printed circuit board including a stack of two or more conductive patterns is preferably used. The coil preferably has a configuration of a stack of such two or more printed circuit boards. The coil thus includes plural conductive patterns, to thereby enhance characteristics such as the coupling coefficient.

The shrink layer may have, on its surface, a surface treated layer. The conductive pattern thus has the surface treated layer, to thereby reduce leakage of the conductive component from the conductive pattern, and diffusion of reactive components (such as oxygen and sulfur) for the conductive component into the conductive pattern.

The material for the surface treated layer is not particularly limited as long as it prevents leakage of the conductive component from the conductive pattern and diffusion of reactive components into the conductive pattern. Examples of the material include metals, resins, ceramics, and mixtures of the foregoing. In particular, preferred materials for the surface treated layer are nickel, tin, gold, and aluminum. The surface treated layer may be formed as a single layer or a multilayer.

The average thickness of the surface treated layer is not particularly limited. The lower limit of the average thickness is preferably 0.01 µm, more preferably 0.03 µm, still more preferably 0.05 µm. On the other hand, the upper limit of the average thickness is preferably 6.0 µm, more preferably 1.0 µm, still more preferably 0.5 µm. When the average thickness of the surface treated layer is less than the lower limit, leakage of the conductive component such as copper from the conductive pattern and diffusion of reactive components into the conductive pattern may not be sufficiently prevented. Conversely, when the average thickness is more than the upper limit, an increase in the cost due to the increase in the thickness may not match the incremental effect of preventing leakage of the conductive component from the conductive pattern and diffusion of reactive components into the conductive pattern.

Incidentally, instead of formation of the surface treated layer, the surface of the conductive pattern may be subjected to antirust treatment using Copper Brite. This Copper Brite is prepared by dissolving a water-soluble polymer such as polyoxyethylene alkyl ether in isopropyl alcohol and hydroxybutyric acid.

INDUSTRIAL APPLICABILITY

The printed circuit board and the electronic component have high-density conductive patterns. Accordingly, the printed circuit board and the electronic component are suitably usable as coils, for example. The method for producing a printed circuit board enables production of the printed circuit board with ease and certainty.

REFERENCE SIGNS LIST 1, 11 printed circuit boards
2, 12 base films
3, 13 conductive patterns
3a, 13a core bodies
3b, 13b shrink layers
4 covering film
5 adhesive layer
10 coil
13c through-hole
M metal foil
S seed layer
X resist pattern
Y metal pattern

The invention claimed is:

1. A printed circuit board comprising a base film having an insulating property, and a conductive pattern formed on at least one of surfaces of the base film,
   wherein at least a portion of the conductive pattern includes a core body, and
   a shrink layer formed by plating on an outer surface of the core body,
   wherein the portion of the conductive pattern has an average circuit gap width of 30 µM or less and 3 µm or more, and
   the shrink layer is formed so as to cover both a top surface and side surfaces of the core body,
   wherein the portion of the conductive pattern has a spiral configuration, and in the spiral portion, a width of the core body increases from an outside to an inside of the spiral portion.

2. The printed circuit board according to claim 1, wherein the portion of the conductive pattern has an average aspect ratio of 0.5 or more.

3. The printed circuit board according to claim 1, wherein the plating is electroplating or electroless plating.

4. The printed circuit board according to claim 1, wherein the core body and the shrink layer have a main component that is copper or copper alloy.

5. The printed circuit board according to claim 1, further comprising a conductive pattern formed on another one of the surfaces of the base film,
   wherein at least a portion of this conductive pattern also includes the core body and the shrink layer.

6. An electronic component comprising the printed circuit board according to claim 1.

7. The printed circuit board according to claim 1, wherein the conductive pattern has a single continuous line configuration including the spiral portion formed on a front surface side of the base film, an outer linear portion connected to an outermost end of the spiral portion, and an inner linear portion formed on a back surface side of the base film and connected via a through-hole to an innermost end of the spiral portion.

* * * * *

UNITED STATES PATENT AND TRADEMARK OFFICE
CERTIFICATE OF CORRECTION

PATENT NO. : 10,111,330 B2
APPLICATION NO. : 15/319997
DATED : October 23, 2018
INVENTOR(S) : Hiroshi Ueda et al.

Page 1 of 1

It is certified that error appears in the above-identified patent and that said Letters Patent is hereby corrected as shown below:

Column 14 In Claim 1, Line 15, "30 µM" should read as --30 µm--

Signed and Sealed this
Eighth Day of January, 2019

Andrei Iancu
*Director of the United States Patent and Trademark Office*